United States Patent [19]
Humphreys

[11] Patent Number: 6,002,273
[45] Date of Patent: Dec. 14, 1999

| [54] | LINEAR LOW NOISE PHASE-FREQUENCY DETECTOR |
|---|---|
| [75] | Inventor: Scott Robert Humphreys, Boynton Beach, Fla. |
| [73] | Assignee: Motorola, Inc., Schaumburg, Ill. |
| [21] | Appl. No.: 09/166,756 |
| [22] | Filed: Oct. 5, 1998 |
| [51] | Int. Cl.$^6$ .................................................. H03D 13/00 |
| [52] | U.S. Cl. .................................. 327/3; 327/7; 327/148 |
| [58] | Field of Search .............................. 327/3, 148, 157, 327/7, 12, 147, 156, 536, 63, 77, 78; 331/25; 363/59, 60 |

[56] References Cited

U.S. PATENT DOCUMENTS

| 4,970,475 | 11/1990 | Gillig .......................................... 331/25 |
| 5,036,216 | 7/1991 | Hihmann et al. ......................... 309/269 |
| 5,052,022 | 9/1991 | Nishita ........................................ 375/4 |
| 5,208,546 | 5/1993 | Nagaraj ..................................... 327/157 |
| 5,233,314 | 8/1993 | McDermott et al. ..................... 331/17 |
| 5,432,481 | 7/1995 | Saito ......................................... 331/45 |
| 5,699,387 | 12/1997 | Seto et al. ................................ 375/376 |
| 5,731,723 | 3/1998 | Chen ....................................... 327/157 |

*Primary Examiner*—Timothy P. Callahan
*Assistant Examiner*—An T. Luu
*Attorney, Agent, or Firm*—James A. Lamb

[57] ABSTRACT

A phase-frequency detector (110) includes an output stage (300) and a control stage (200). The output stage includes a pump up switched current source (350), a pump down switched current sink (360), and a constant current source (325) that are coupled to a charge pump output node (111). The control stage generates, in response to a divided variable frequency signal (FV) (136) and a reference frequency signal (FR) (106), a pump up control signal (246) and a pump down control signal (216).

16 Claims, 5 Drawing Sheets

LINEAR LOW NOISE PHASE-FREQUENCY DETECTOR

FIELD OF THE INVENTION

This invention relates in general to phase-frequency detectors, and in particular to charge pump phase-frequency detectors used in phase lock loops.

BACKGROUND OF THE INVENTION

A known technique for obtaining extremely fine frequency resolution in a phase lock loop (PLL) is to use a sigma delta modulator that modifies the value of N in a 1/N divider in the feedback loop of the frequency synthesizer. While the phase lock loop is in lock, the value of N is modified between two or more values, by use of a sequence of integer values that are typically low integer values (e.g., 0's and 1's). The sequence of integer values are coupled to the 1/N divider and an output of the 1/N divider is coupled to a phase-frequency detector. The sequence of integer values causes noise in the PLL that appears as modulation noise in the output of the PLL. An advantage of using a sigma delta modulator is that the noise is noise shaped such that its spectral content is concentrated at high frequencies. A low-pass response of the PLL attenuates the high frequency noise such that it does not significantly modulate the output of the PLL.

It has been experimentally determined that the transfer function for a PLL that uses a sigma delta modulator in this fashion must be very linear to avoid undesirable sequence value dependent responses that degrade the noise shaping properties of the sigma delta modulator. The portion of the PLL that most typically introduces such non-linearities and the resultant degradation is the phase-frequency detector, which typically is a charge pump detector.

Two types of charge pump detectors have been used in the past. Although they have both been successfully employed, both of them have undesirable characteristics that are increasingly important in modern, very low power and high frequency devices, such as pagers and cellular phones. The first type is a tri-state charge pump phase-frequency detector. In this type of phase-frequency detector, a pump up switched current source and pump down switched current sink are coupled together forming a charge pump output. When an output of the 1/N divider lags a reference signal, the pump up current source is activated, and when the output of the 1/N divider leads the reference signal, the pump down current source is activated. When the PLL is in phase lock, either the source or sink is turned on during each cycle for a very brief time. This tri-state charge pump has an advantage of very low average current drain, but the operation of the tri-state charge pump degrades the noise shaping of the sigma delta modulator due to gain and transient characteristic differences between the current source and sink that introduce a non-linear performance. It is very difficult in practice to match the gain differences and transient characteristics of the source and sink.

The second type of phase-frequency detector is a dual state phase frequency detector, in which a pump up constant current source is on continuously and a pump down current sink having twice the value of the pump up constant current source is turned on when the output of the 1/N divider leads the reference signal. This results in a 50/50 duty cycle. Switching only the pump down sink results in a very linear charge pump output characteristic. Although this approach substantially reduces noise due to non-linearity, it generates undesirable noise from the constant current source and the switched current sink, which are active a large portion of the time. The high duty cycle is particularly a problem in CMOS devices which are desirable for their low cost but which inherently have high flicker noise. This has resulted in the use of expensive bipolar or BiCMOS processes in high performance applications.

Thus, what is needed is a linear phase-frequency detector that reduces the coupling of device noise into the PLL output.

DETAILED DESCRIPTION OF THE PREFERRED EMBODIMENT

Figure 1:
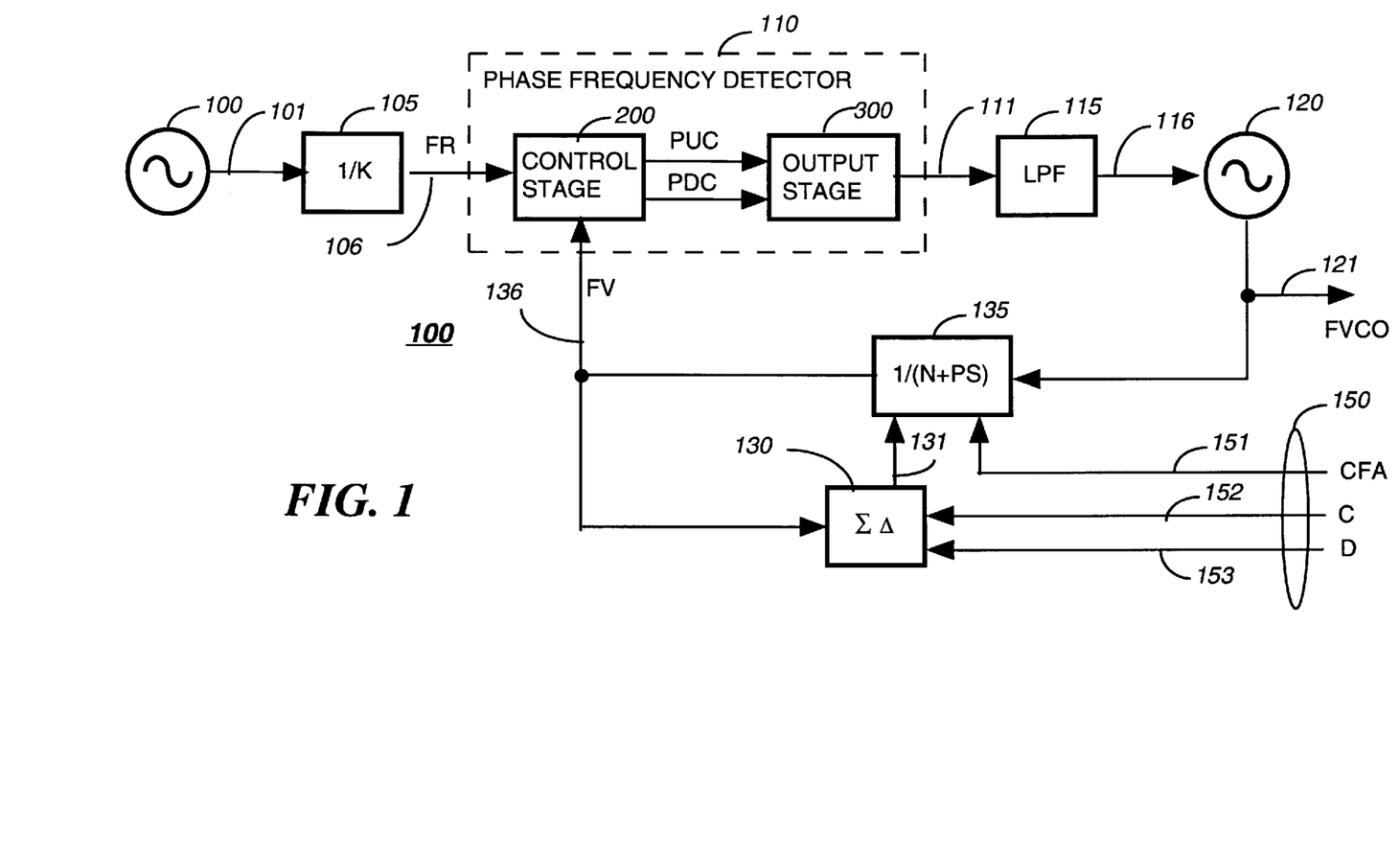
FIG. 1 is an electrical block diagram of a phase lock loop circuit that includes a phase-frequency detector, in accordance with the preferred embodiment of the present invention.

Referring to FIG. 1, an electrical block diagram of a phase lock loop circuit that includes a linear, low noise phase-frequency detector is shown, in accordance with the preferred embodiment of the present invention. The phase look loop comprises a crystal based reference oscillator 102 that generates a signal 101 that is coupled to a divider 105 that is set at a fixed division ratio for a given carrier frequency. The divider 105 converts the signal 101 to a reference frequency signal (FR) 106 that is coupled to a phase-frequency detector 110. The phase-frequency detector 110 generates an output current, Iout, that is coupled to a low pass filter 115. A filtered output signal 116 from the low pass filter 115 is coupled to a voltage controlled oscillator 120 that generates an output signal (Fvco) 121 having a frequency that is determined by an input control 150 comprising three signals: a coarse frequency adjust (CFA) signal 151, a numerator value (C) 152, and a denominator value (D) 153. The CFA signal 151 is coupled to an input of a divider 135 and sets a base value of division, N, of the fractional divider 135. The fractional divider 135 is also coupled to a sequence of values 131 generated by a sigma delta modulator 130. The divider 135 has an input coupled to Fvco 121, and divides the frequency of Fvco 121 by the value N plus a most recent value received in the sequence of values 131. The values in the sequence of values 131 are zeros and ones, but could alternatively be other small integer values. As a result, the divider 135 generates a divided variable signal (FV) 136 that has an average frequency determined by the CFA signal 151 and the sequence of values 131. The sequence of values 131, when averaged over a large number of cycles of the FV signal 136, have an average value between 0 and +1. Thus, the FV signal 136 has an average frequency determined by an average value of the divider 135, the average value being between N and N+1. The sigma delta modulator stage 130 generates the sequence of values 131 based on the ratio of the numerator value 152 to the denominator value 153, and generated at a rate determined by the FV signal 136, which is coupled to an input of the sigma delta modulator 130 and to an input of the phase-frequency detector 110.

The general architecture of the phase lock loop 100 is conventional, and all of the elements described above with reference to FIG. 1 are conventional, except for the unique phase-frequency detector 110. The low pass filter 115 comprises a capacitor that integrates the output signal of the output stage 300, and the low pass filter 115 suppresses high frequency noise components generated by the sequence of values 131 that vary the divisor in the divider 135. The phase-frequency detector 110 comprises a control stage 200 that is coupled to an output stage 300 by a pump up control (PUC) signal 246 and a pump down control (PDC) signal 216.

Figure 2:
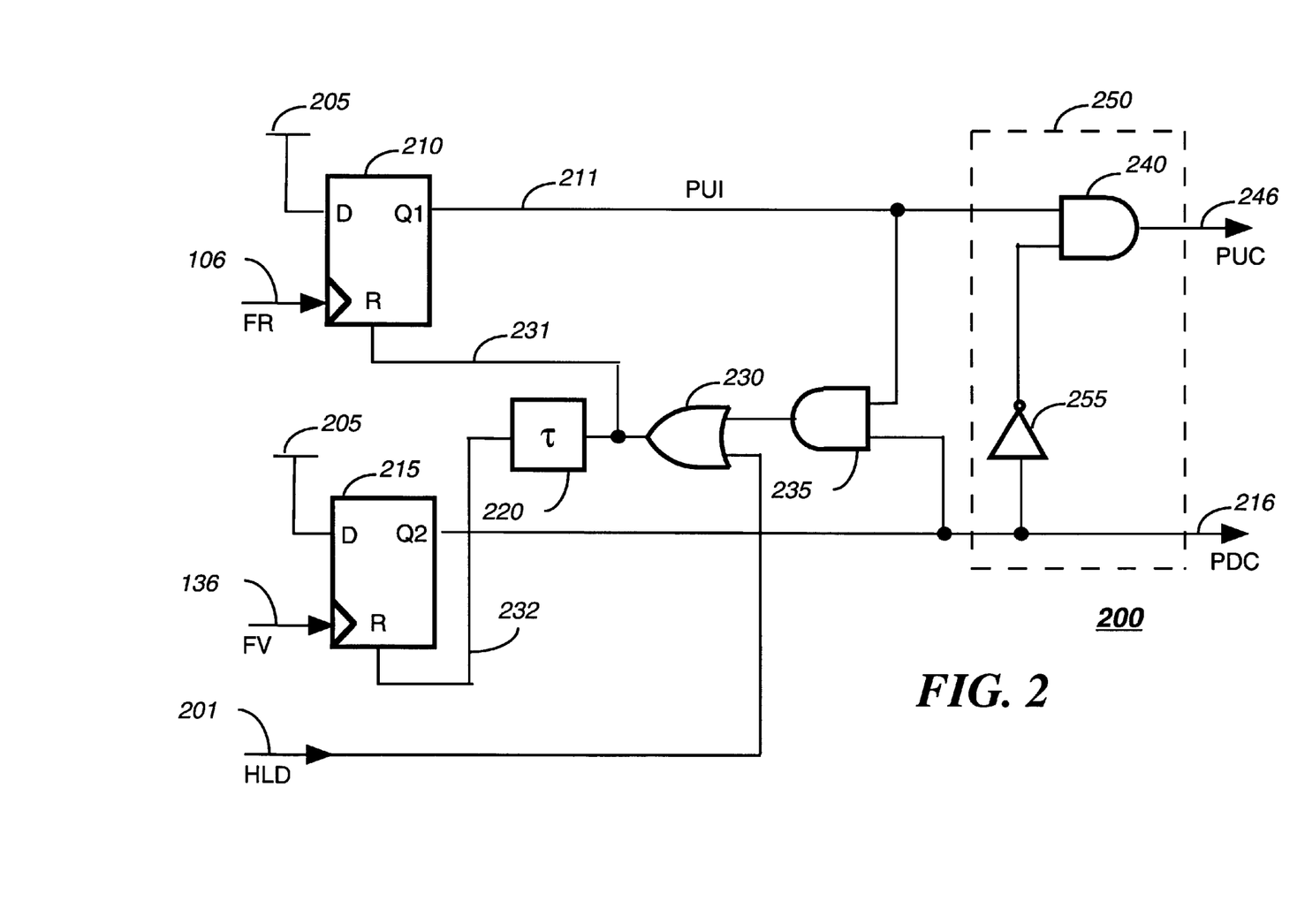
FIG. 2 is an electrical block diagram of a control stage of the phase-frequency detector, in accordance with the preferred embodiment of the present invention.

Referring to FIG. 2, an electrical block diagram of the control stage 200 of the phase-frequency detector 110 is shown, in accordance with the preferred embodiment of the present invention. The control stage 200 comprises a first flip-flop 210 that has a clock input coupled to the FR signal 106. The first flip-flop 210 sets a pump up internal (PUI) signal 211 that is generated at a first output (Q1) to an active state (a logic high in this embodiment) in response to a rising edge of the FR signal 106. A second flip-flop 215 has a clock input coupled to the FV signal 136. The second flip-flop 215 sets the PDC signal 216 generated at a second output (Q2) to the active state in response to a rising edge of the FV signal 136. An inhibit gate element 250 that is coupled to the PUI signal 211 and PDC signal 216 generates the PUC signal 246. The inhibit gate element 250 comprises an AND gate 240 having the PUI signal 211 as a first input and also comprises an inverter 255 having PDC signal 216 as an input. An output of the inverter 255 is coupled to a second input of the AND gate 240. The PUC signal 246 is generated at the output of the AND gate. The control stage 200 also comprises an AND gate 235 that has the PUI signal 211 and PDC signal 216 coupled thereto as inputs, and a delay element 220 that has an input coupled to an output of the AND gate 235 through an OR gate 230. The first flip-flop 210 has a first reset input that is coupled to a reset up (RU) signal 231 generated by the AND gate 235 and passed through the OR gate 230. The second flip-flop 215 has a second reset input that is coupled to a reset down (RD) signal 232 generated at the output of the delay element 220. The delay element 220 preferably comprises at least two inverters coupled in series, thereby inducing a predetermined duration, τ seconds, that is at least two gate delays, into the RD signal 232 that is coupled to the reset input of flip-flop 215. A hold signal (HLD) 201 is coupled to an input of the OR gate 230. All of the logic circuits 210,215, 220,230,235,240,255 are preferably fabricated from standard CMOS logic.

A generic, brief description of the operation of the control stage 200 is as follows. When the FV signal 136 lags the FR signal 106 by a lag time 410 (FIG. 4), the control stage 200 generates the PUC signal 246 having the active state with a duration that is essentially equal to the lag time 410, and generates the PDC signal having the active state with a duration that is essentially equal to the predetermined duration, τ. When the FV signal 136 leads the FR signal 106 by a lead time 418 (FIG. 4), the control stage 200 generates the PUC signal 246 having a constant inactive state (a logic low in this embodiment), and generates the PDC signal 216 having the active state that is equal to the predetermined duration, τ, plus the lead time 418. A more detailed description of the operation of the control stage 200 is provided below, with reference to FIGS. 4 and 5. It will be appreciated that the unique characteristics provided by the control stage 200 that have been described herein can be provided equally well by other combinations of sequential and combinational logic elements.

Figure 3:
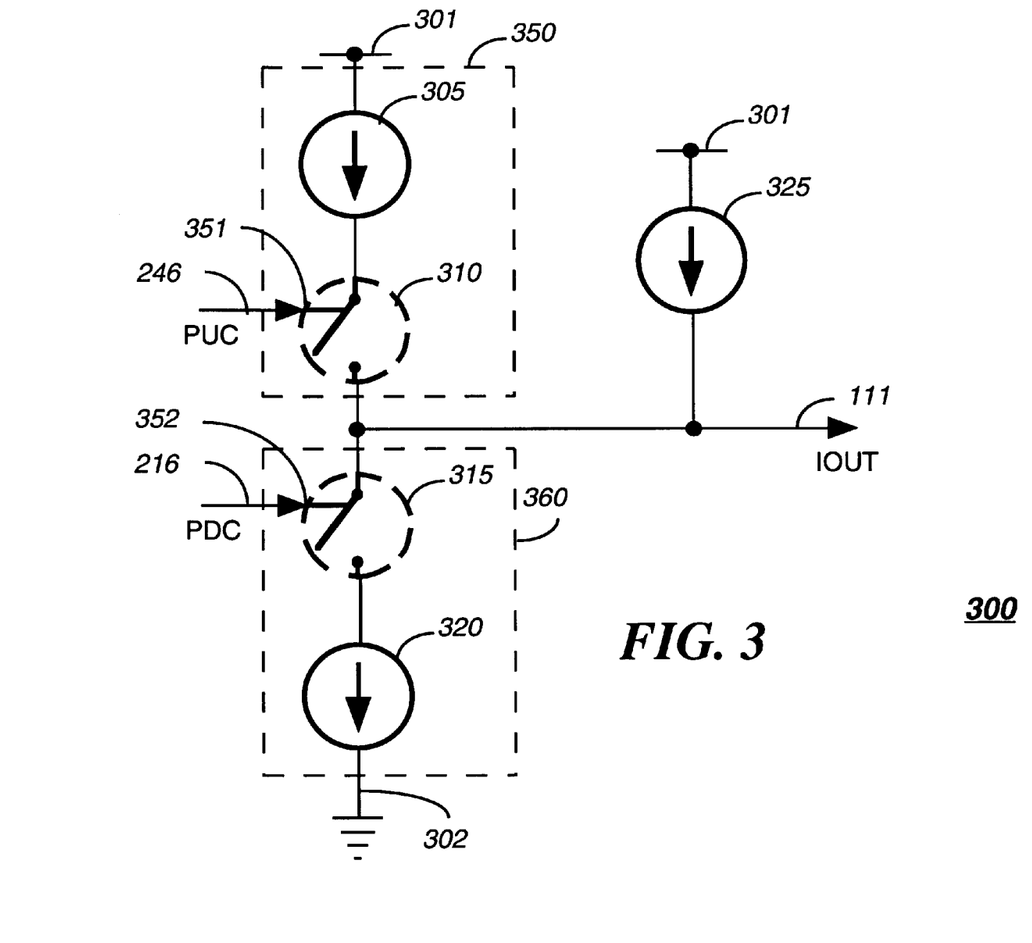
FIG. 3 is an electrical block diagram of an output stage of the phase-frequency detector, in accordance with the preferred embodiment of the present invention.

Referring to FIG. 3, an electrical block diagram of the output stage 300 of the phase-frequency detector 110 is shown, in accordance with the preferred embodiment of the present invention. The output stage 300 comprises a pump up switched current source 350 that sources a current of a first value, $I_1$, at a pump output node 111 when a first control input 351 is in the active state. The output stage 300 also comprises a pump down switched current sink 360 that sinks a current of a second value, $I_2$, at the pump output node 111 when a second control input 352 is in the active state. The output stage 300 also comprises a constant current source 325 that sources a current of a third value, $I_3$, at the pump output node 111. The PUC signal 246 is coupled to the first control input 351 and PDC signal 216 is coupled to the second control input 352. The switched current source 350 is supplied by a power supply 301, and the switched current sink sinks its current into a ground reference 302 of the power supply. The switched current source 350 preferably comprises a switch FET 310 coupled in series with a source FET 305 and the switched current sink 360 preferably comprises a switch FET 315 coupled in series with a sink FET 320. The constant current source 325 is preferably a FET. The FETs 305, 310, 315, 320, 325 are preferably implemented in CMOS. In accordance with the preferred embodiment of the present invention, $I_1$ is approximately equal to $I_2$, and the ratio $I_3/I_1$ is made very small in a typical use of the present invention. This is described in more detail below. The currents $I_1$ and $I_2$ are designed to be approximately equal by using conventional techniques to produce equivalent geometries for the FETs 305,320, and also by driving them from a conventional current mirror that is common to both FETs 305, 320. Thus, the currents $I_1$ and $I_2$ are equal to within the tolerances of standard CMOS processes. The current $I_3$ is designed using conventional techniques to provide a FET geometry that results in $I_3$ being a desired fraction of the value of $I_1$.

Figure 4:
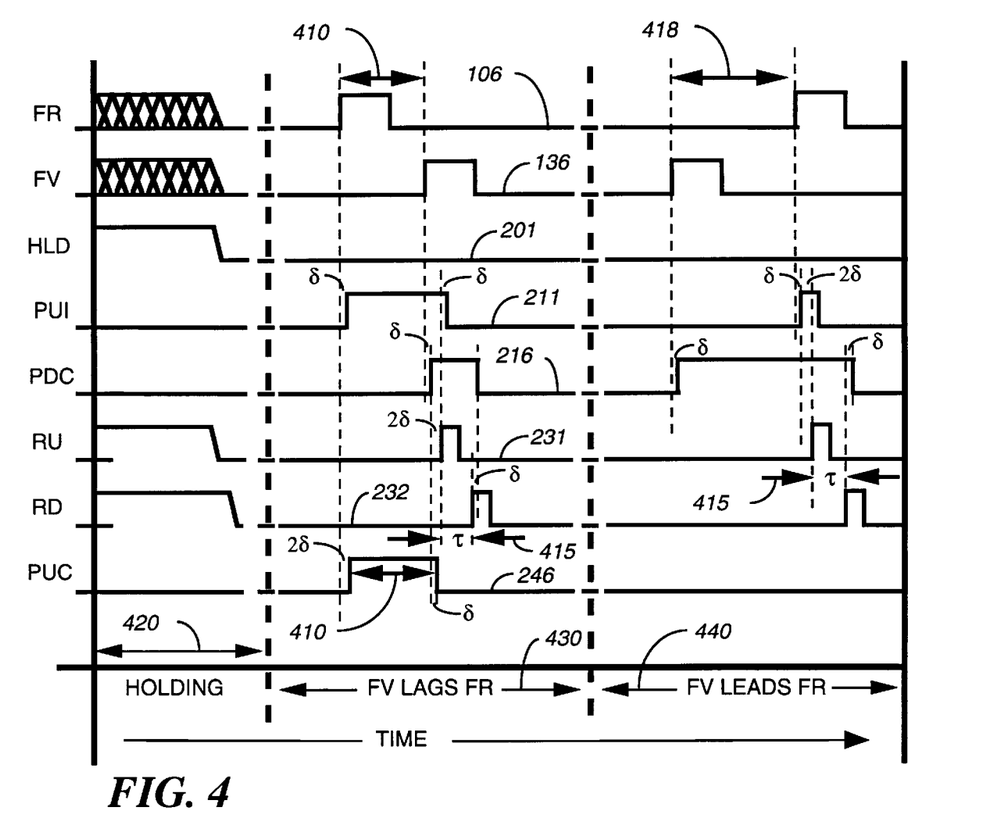
FIG. 4 is a timing diagram which illustrates signals generated by the control circuit under various conditions, in accordance with the preferred embodiment of the present invention.

Referring to FIG. 4, a timing diagram which illustrates signals generated by the control stage 200 under various conditions is shown, in accordance with the preferred embodiment of the present invention. The FR signal 106 is a periodic signal having frequency Fr and period Tr that consists of one pulse during each period of the FR signal 106. The FV signal 136 is a nearly periodic signal having an approximate frequency of Fr, consisting of one pulse during almost all periods of the FR signal 106. Three different conditions are illustrated. The first condition 420 is a holding condition, which arises when the HLD 201 (FIG. 2) signal is in the active state. The second and third conditions arise when HLD 201 is in the inactive state. The second condition 430 arises when the FV signal 136 lags the FR signal 106 following a reset of both the first and second flip-flops 210, 235, and is alternatively referred to as a positive phase error condition. The time difference from a leading edge of the pulse of the FR signal 106 to a leading edge of the pulse of the next FV signal 136 in the second condition is the lag time, Tlag 410. The third condition 430 arises when the FV pulse leads the FR pulse, during which the time difference from the leading edge of the FR pulse to the leading edge of the next FV pulse is more than one half of the period of the FR signal 106. The third condition is alternatively referred to as a negative phase error condition. The time difference in the third condition is the lead time, Tlead, 418.

When the control stage 200 is in the second condition, the PUI signal 211 is set to the active state by the rising edge of the FR pulse (the transition of the PUI signal 211 occurs one logic device delay, δ seconds, after the rising edge of the FR signal 106). Later, the rising edge of the FV signal 136 sets the PDC signal 216 to the active state (one logic device delay, δ seconds, after the rising edge of the FV signal 136), which causes the RU signal 231 to go to the active state two logic device delays, 2 δ seconds, after the PDC signal 216 goes to the active state. This resets the flip-flop 210. The RD signal 232 is equivalent to the RU signal 231, delayed by r seconds by the delay element 220. The rising edge of the RD signal 232 resets the PDC signal 216 after one logic device delay. The PUC signal 246 goes to the active state one logic device delay after the PUI signal 211 goes to the active state, which is two logic device delays after the rising edge of the FR signal 106. The PUC signal goes back to the inactive state one logic device delay after the rising edge of the PDC signal 216. Thus, the PUC signal 246 has a pulse duration, Tpuc, essentially equal to Tlag (the lag time 410). The PDC signal 216 has a pulse duration, Tpdc, equal to τ+3 δ, which is a predetermined duration.

An average current sourced at the output node 111 when the phase lock loop 100 is locked, during the second condition, is given by:

Iavg=(Qconstant+Qup−Qdown)/Tr wherein Q constant is the charge sourced by the constant current source 325 during period Tr, Qup is the charge sourced by the pump up switched current source 350 during one period Tr, and Qdown is the charge sunk by the pump down switched current source 360 during one period Tr. From the above descriptions and formula:
Qconstant=I3(Tr)
Qup=I1(Tlag)
Qdown=I2(τ+3 δ)
Therefore
Iavg=(I3(Tr)+I1(Tlag)−I2(τ+3 δ))/Tr or
Iavg=I3+I1(Tlag/Tr)−I2(τ+3 δ)/Tr When the control stage 200 is in the third condition, the PDC signal 216 is set to the active state by the rising edge of the FV signal 136 (the transition occurs one logic device delay, δ seconds, after the rising edge of the FV signal 136). Then the rising edge of the FR signal 106 sets the PUI signal 211 to the active state (after one logic device delay), which causes the RU signal 231 to go to the active state two logic device delays after the PUI signal 211 goes to the active state. This resets the flip-flop 210. The RD signal 232 is equivalent to the RU signal 231, delayed by τ seconds by the delay element 220. The rising edge of the RD signal 232 resets the PDC signal 216 after one logic device delay. The PUC signal 246 is uniquely kept in the inactive state by the inverted PDC signal that is coupled to the AND gate 240. The PDC signal 216 has a pulse duration, Tpdc, equal to Tlead+τ+3 δ, which can be described as the lead time plus the predetermined duration of the PDC in the second condition. It will be appreciated that the delay element 220 is uniquely used in the phase-frequency detector 110 for the purpose of guaranteeing that the first flip-flop 210 is reset before the second flip-flop 215, thereby assuring that, in the third condition, the PUC signal 246 is never active, and thus extending the linearity of the phase response near the point where the lead time and lag time are very small.

An average current during the third condition is given from the above descriptions and formula by:
Qconstant=I3(Tr)
Qup=0
Qdown=I2(Tlead+τ+3 δ)
Therefore
Iavg=I3−I2(Tlead)/Tr−I2(τ+3 δ)/Tr Referring to FIG. 5, a graph of Iavg versus Tlag and Tlead is shown, in which Tlag is shown as a positive value and Tlead is shown as a negative value, in accordance with the preferred embodiment of the present invention. The graph of Iavg versus Tlag is a straight line 510 having a slope of I1/Tr. The graph of Iavg versus Tlead is a straight line 520 having a slope of −I2/Tr. The desired mode of operation of the phase-frequency detector is to achieve phase lock in the third condition. In phase lock, Iavg approaches zero. In phase lock a constant time offset at phase lock, Tbias 530, is found from the above equations to be Tbias=(I2/I1)(τ+3 δ)−(I3/I1)Tr for the second condition, and Tbias=(I3/I2)Tr−(τ+3 δ) for the third condition.

Figure 5:
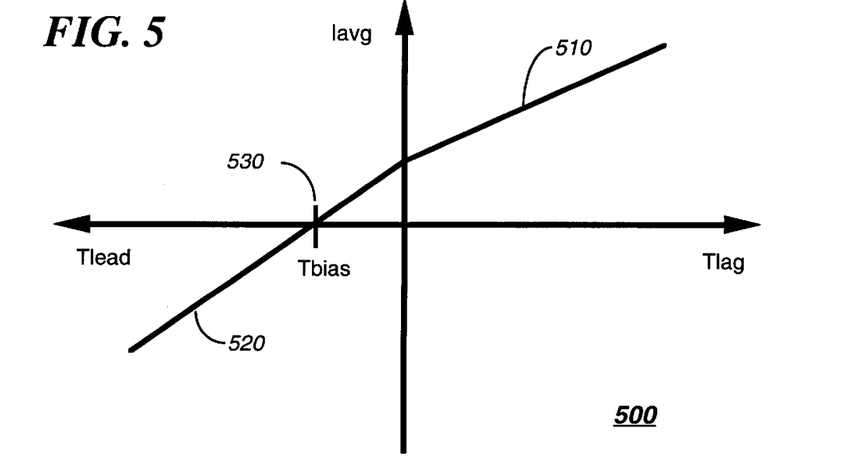
FIG. 5 is a graph of average current supplied by the phase-frequency detector versus lag and lead times, in accordance with the preferred embodiment of the present invention.

The desired lock condition of Fv leading Fr is assured if Tbias 530 is negative for the second condition and positive for the third condition.

From these equations, it will be appreciated that Tbias 530 is negative for the second condition and positive for the third condition when
I3/I2>(τ+3 δ)/Tr.

This condition is relatively simple to meet when the phase-frequency detector is designed, since logic delays are usually significantly shorter than the reference period, Tr. Advantageously, the duty cycle of the pump down pulse (the active state of the PDC signal 216) is essentially determined by the ratio of the leakage and pump down current sources, which is very easy for a designer to set to any desired value.

It will be appreciated that the logic device delays and gate delays described above can have different values, depending on what type of logic circuit produces the delay (i.e., the delay of an AND gate may be different than the reset delay of a flip-flop) but that typical values are specified by the manufacturer of the circuits or determined through simulation. Therefore the value τ+3 δ used in the equation for Tbias 530 is predetermined from delays specified by the manufacturer(s) of the circuits or determined through simulation.

It will be appreciated that when the phase lock loop 100 is in lock in the third condition, the phase-frequency detector 110 operates identically to a prior art dual-state phase-frequency detector, in that the inhibit gate element 250 completely disables the pump up switched current source 350 when in this locked state, thereby further improving linearity over a prior art tri-state phase-frequency detector. Because the duty cycle of the new phase-frequency detector is relatively small the noise contribution of the active devices is greatly reduced in comparison to a prior art dual state phase-frequency detector. A duty cycle of approximately 2% is typical, resulting in a ratio of I3 to I2 of approximately 1 to 50. The low current of the leakage source allows a relatively large and low noise PMOSFET to be used as the constant current source, further improving noise over a prior art dual state phase-frequency detector. A designer need only determine that Thias 530 is large enough to allow for variations in the sequence of values 131 generated by a sigma delta modulator 130 that result in variation in the instantaneous value of the lead time 418, and in doing so will guarantee that the phase lock loop 100 will maintain lock in the third condition, and thus operate in the "dual-state" mode. During lock acquisition, when the phase errors are larger than Tbias 530, the phase-frequency detector 110 operates substantially like a prior art tri-state phase-frequency detector.

It will be appreciated that some improvements of prior art tri-state phase detectors are equally applicable to the phase-frequency detector 110, such as a set of D type flip-flops that are added to provide constant slewing for faster lock, as described in Crawford, James, "Frequency Synthesizer Design Handbook," Artech House, Boston, 1994.

Figure 6:
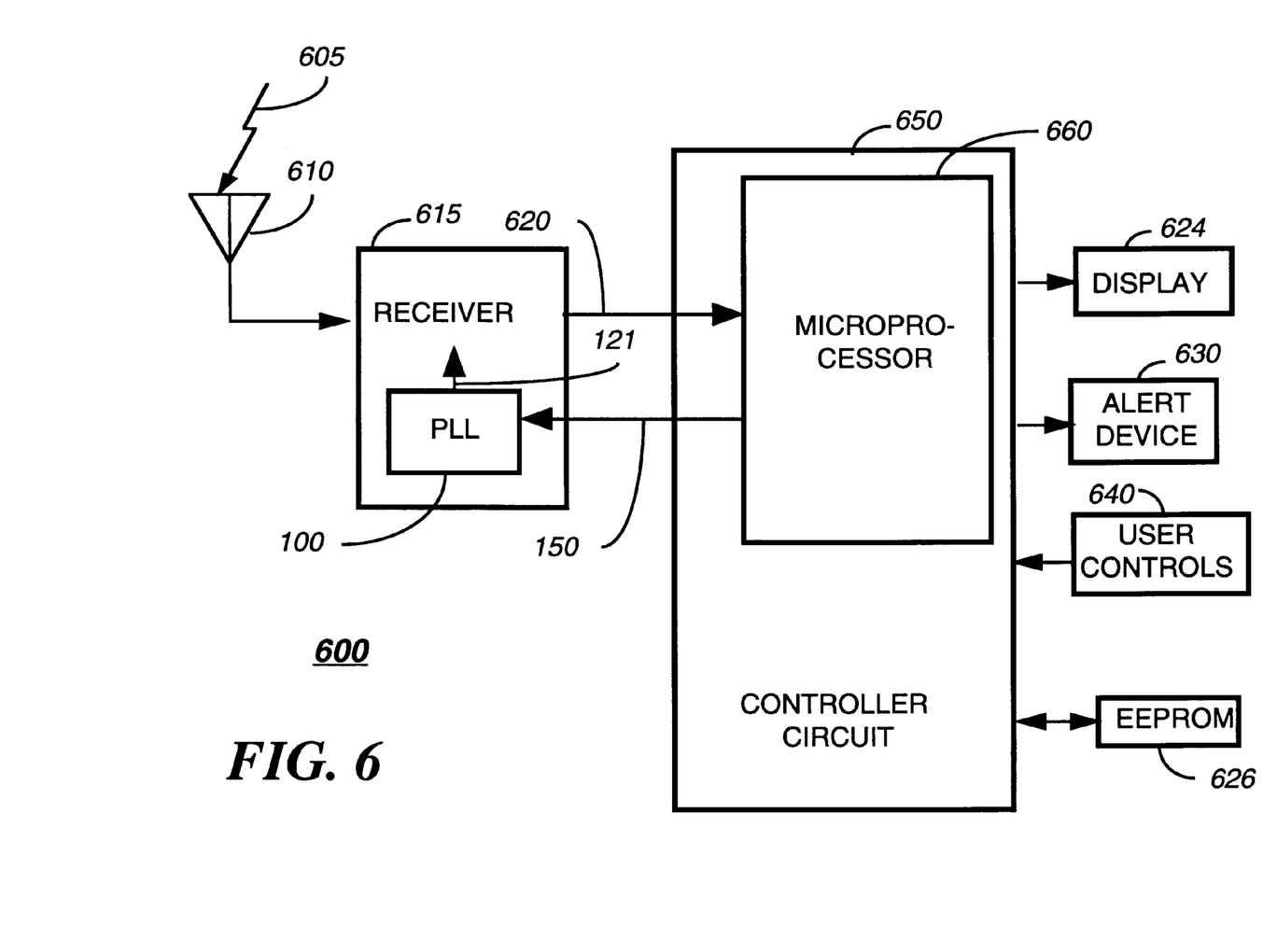
FIG. 6 is an electrical block diagram of a multichannel selective call radio, in accordance with the preferred embodiment of the present invention.

Referring to FIG. 6, an electrical block diagram of a multichannel selective call radio 600 is shown, in accordance with the preferred embodiment of the present invention. The selective call radio 600 comprises a receiver section 615 and a controller circuit 650. A conventional antenna 610 intercepts radiated radio frequency (RF) signals 605 that are converted by the antenna 610 to conducted RF signals that are coupled to the receiver section 615. The receiver section 615 performs conventional receiving functions of filtering unwanted energy from the RF signal, converting the RF signal, and generating a demodulated signal 620 that is coupled to the controller circuit 650, but uses the unique phase lock loop 100 to generate the output signal Fvco 121 as a local oscillator signal. The controller circuit 650 generates the input control 150 that is coupled to the phase lock loop 100 and that sets the frequency of Fvco 121. The controller is also coupled to a display 624, an alert 630, a set of user controls 640, and an electrically erasable read only memory (EEPROM) 626. The controller circuit 650 comprises a microprocessor 660, as well as other circuits not shown in FIG. 1, such as power regulation circuits.

The microprocessor 660 is coupled to the EEPROM 626 for storing an embedded address and other configuration information that is stored therein during a maintenance operation, and the microprocessor 660 loads the embedded address during normal operations of the selective call radio 600. The microprocessor 660 is a digital signal processor of conventional circuit design, comprising a central processing unit (CPU), a read only memory (ROM), and a random access memory (RAM).

A conventional message processor function of the microprocessor 660 decodes an outbound selective call message, generating data words that have been coded within an outbound signaling protocol conveyed by the radio signal 605, and processes an outbound selective call message when an address received in an address field of the outbound signaling protocol matches the embedded address stored in the EEPROM 626, in a manner well known to one of ordinary skill in the art for a selective call radio. An outbound selective call message that has been determined to be for the selective call radio 600 by the address matching is processed by the message processor function according to the contents of the outbound message and according to modes set by manipulation of the set of user controls 640, in a conventional manner. An alert signal is typically generated when an outbound message includes user information. The alert signal is coupled to the alert device 630, which is typically either an audible or a silent alerting device.

The phase lock loop 100 is preferably integrated in one integrated circuit, and is preferably part of an integrated circuit that includes most of the circuitry of the receiver section 615. The phase lock loop 100 could alternatively be fabricated as a plurality of small scale integrated circuits.

It will be appreciated that the phase-frequency detector 110 provides the benefits of low cost, low power, low noise in electronic equipment other than a selective call radio, such as broadcast and wired receivers, transmitters (wireless or wired), disk drives, and tape recorders, in which phase lock loops are used. While the phase-frequency detector 110 is described herein as being used with a phase lock loop that uses a sigma delta modulator, it will be appreciated that the phase-frequency detector 110 provides similar benefits in any phase lock loop circuit in which phase linearity is important.

By now it should be appreciated that there has been provided a new charge pump phase-frequency detector 110 that exhibits both low noise and high linearity. The phase-frequency detector 110 allows a designer to make trade-offs between device sizes, current levels and duty cycles to meet the needs of a wide variety of systems. In particular the phase-frequency detector 110 allows sigma delta fractional-N phase lock loop frequency synthesizers to be implemented in CMOS processes, which are usually noted for high levels of noise. This enables a variety of communication products to benefit from the fine frequency resolution and fast lock times of sigma delta phase lock loops implemented with low cost, low power and high integration CMOS processes.

I claim:

1. A phase-frequency detector, comprising:

an output stage; and a control stage coupled to the output stage that generates, in response to a divided variable frequency signal (FV) and a reference frequency signal (FR), a pump up control signal and a pump down control signal, wherein when FV lags FR by a lag time, the control stage generates the pump up control signal having the active state with a duration that is essentially equal to the lag time, and generates the pump down control signal having the active state with a duration that is essentially equal to a predetermined duration, and wherein when FV leads FR by a lead time, the control stage generates the pump up control signal having a constant inactive state, and generates the pump down control signal having the active state that is equal to the predetermined duration plus the lead time.

2. The phase-frequency detector according to claim 1, wherein the control stage comprises:

a first flip-flop, having a clock input coupled to FR, wherein the first flip-flop generates a pump up internal signal that is set to the active state in response to an edge of FR;

a second flip-flop, having a clock input coupled to FV, wherein the second flip-flop generates the pump down control signal that is set to the active state in response to an edge of FV; and an inhibit gate element, coupled to the pump up internal signal and the pump down control signal, that generates the pump up control signal.

3. The phase-frequency detector according to claim 2, wherein the inhibit gate element comprises:

an AND gate having the pump up internal signal as a first input; and an inverter having the pump down control signal as an input, an output of which is coupled to a second input of the AND gate, wherein the pump up control signal is generated at the output of the AND gate.

4. The phase-frequency detector according to claim 2, wherein the control stage comprises:
- an AND gate that has the pump up internal signal and pump down control signal coupled thereto as inputs; and
- wherein the first flip-flop has a first reset input that is coupled to the output of the AND gate, and
- wherein the second flip-flop has a second reset input that is coupled to an output of the delay element.

5. The phase-frequency detector according to claim 4, wherein the control stage further comprises:
- a delay element that has an input coupled to an output of the AND gate.

6. The phase-frequency detector according to claim 1, wherein the phase-frequency detector is implemented in one integrated circuit.

7. The phase-frequency detector according to claim 1, comprising a pump up switched current source coupled to a charge pump output node that sources a first current, I1, in response to a pump up control signal, a pump down switched current sink coupled to the charge pump output node that sources a second current, I2, in response to a pump down control signal, and a constant current source continuously sourcing a third current, I3, at the charge pump output node.

8. The phase-frequency detector according to claim 7, wherein I1 is substantially equal to I2 and a ratio of I3 to the I2 is approximately 1:50.

9. The phase-frequency detector according to claim 7, wherein I1 is substantially equal to I2 and a ratio of I3 to I2 is greater than a ratio of the predetermined duration to a period of the reference frequency signal, FR.

10. An electronic equipment, comprising a phase-frequency detector that comprises:
- an output stage; and
- a control stage coupled to the output stage that generates, in response to a divided variable frequency signal (FV) and a reference frequency signal (FR), a pump up control signal and a pump down control signal,
- wherein when FV lags FR by a lag time, the control stage generates the pump up control signal having the active state with a duration that is essentially equal to the lag time, and generates the pump down control signal having the active state with a duration that is essentially equal to a predetermined duration, and
- wherein when FV leads FR by a lead time, the control stage generates the pump up control signal having a constant inactive state, and generates the pump down control signal having the active state that is egual to the predetermined duration plus the lead time.

11. An electronic equipment, comprising a phase-frequency detector that comprises:
- an output stage comprising
  - a pump up switched current source coupled to a charge pump output node that sources a first current, I1, in response to a pump up control signal,
  - a pump down switched current sink coupled to the charge pump output node that sources a second current, I2, in response to a pump down control signal, and
  - a constant current source continuously sourcing a third current, I3, at the charge pump output node; and
- a control stage coupled to the output stage that generates, in response to a divided variable frequency signal (FV) and a reference frequency signal (FR), a pump up control signal and a pump down control signal,
- wherein when FV leads FR the control stage inhibits the pump up signal.

12. A phase-frequency detector, comprising:
- an output stage comprising
  - a pump up switched current source coupled to a charge pump output node that sources a first current, I1, in response to a pump up control signal,
  - a pump down switched current sink coupled to the charge pump output node that sources a second current, I2, in response to a pump down control signal, and
  - a constant current source continuously sourcing a third current, I3, at the charge pump output node; and
- a control stage coupled to the output stage that generates, in response to a divided variable frequency signal (FV) and a reference frequency signal (FR), a pump up control signal and a pump down control signal,
- wherein when FV leads FR the control stage inhibits the pump up signal.

13. The phase-frequency detector according to claim 12, wherein when FV lags FR by a lag time, the control stage generates the pump up control signal having an active state with a duration that is essentially equal to the lag time, and generates the pump down control signal having the active state with a duration that is essentially equal to a predetermined duration, and
wherein when FV leads FR by a lead time, the control stage generates the pump down control signal having the active state that is equal to the predetermined duration plus the lead time.

14. The phase-frequency detector according to claim 12, wherein I1 is substantially equal to I2 and the control stage generates the pump up control signal and pump down control signal such that a constant time offset that occurs during phase lock is determined by a product of a period of the reference frequency signal and a ratio of I3 to I2.

15. The phase-frequency detector according to claim 12, wherein I1 is substantially equal to I2 and a ratio of I3 to I2 is approximately 1:50.

16. The phase-frequency detector according to claim 12, wherein the phase-frequency detector is implemented in one integrated circuit.

* * * * *